US005483467A

United States Patent [19]
Krupka et al.

[11] Patent Number: 5,483,467
[45] Date of Patent: Jan. 9, 1996

[54] PATCHING PANEL SCANNER

[75] Inventors: Yaacov Krupka, Rehovot; Yehuda Zisapel, Tel-Aviv, both of Israel

[73] Assignee: RIT Technologies, Ltd., Tel-Aviv, Israel

[21] Appl. No.: 896,420

[22] Filed: Jun. 10, 1992

[51] Int. Cl.⁶ .............................. H04M 3/28; H04Q 1/14
[52] U.S. Cl. ............................ 364/550; 375/258; 370/14; 361/627; 361/686
[58] Field of Search ................................... 364/514, 550; 375/10, 36; 379/245, 246, 293; 370/13, 14, 54; 361/600, 627, 679, 686; 340/825.06, 825.07; 371/15.1, 20.1

[56] References Cited

U.S. PATENT DOCUMENTS 4,937,825  6/1990  Ballard et al. ........................ 371/20.1
5,226,120  7/1993  Brown et al. .......................... 395/200

FOREIGN PATENT DOCUMENTS 357634  7/1980  Austria.
2680067  2/1993  France.
2236398  4/1991  United Kingdom.

OTHER PUBLICATIONS

"The Great Cabling Treasure Hunt" by M. Jander, Data Communications, Mar. 21, 1991.

Primary Examiner—Ellis B. Ramirez
Assistant Examiner—Edward Pipala
Attorney, Agent, or Firm—Ladas & Parry

[57] ABSTRACT

A local area network including cabling interconnecting a plurality of workstations, the cabling including a plurality of data ports and conductors for selectable and removable interconnection between selected ones of the data ports and apparatus for automatically providing an indication of the connection pattern of the data ports.

28 Claims, 15 Drawing Sheets

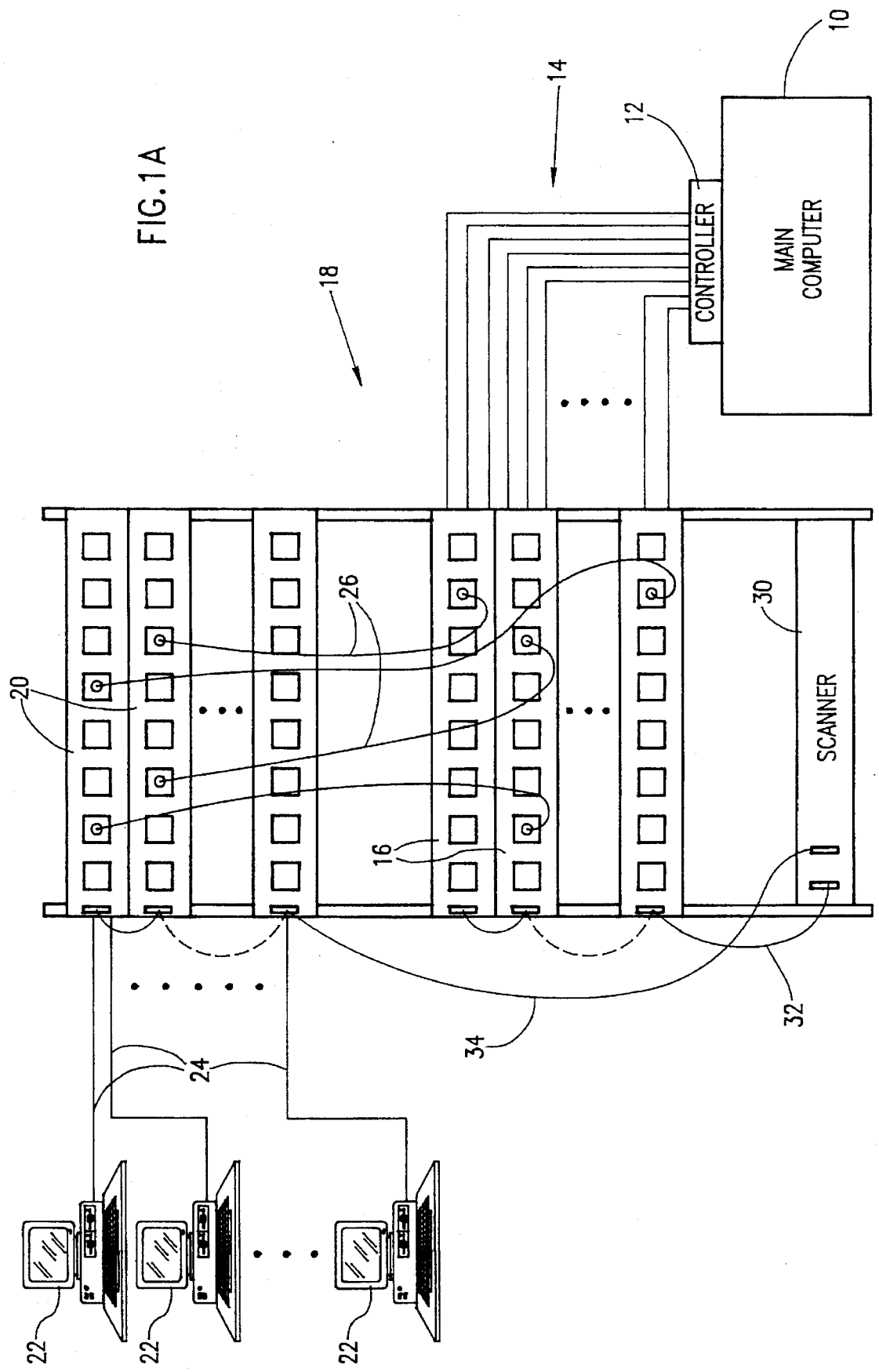

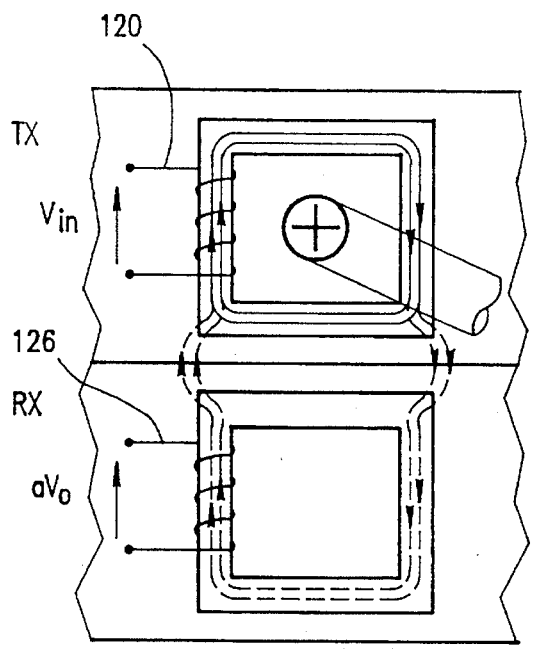
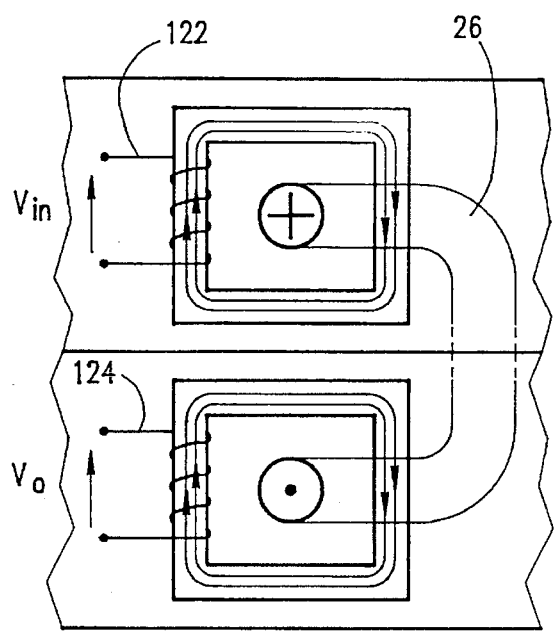
FIG.10A                 FIG.10B
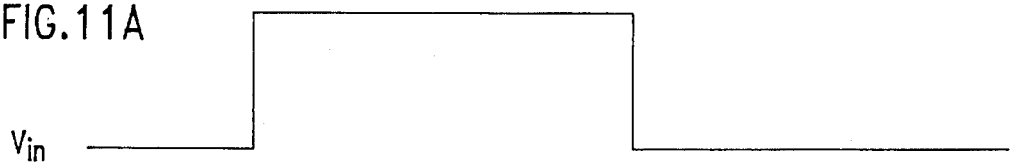
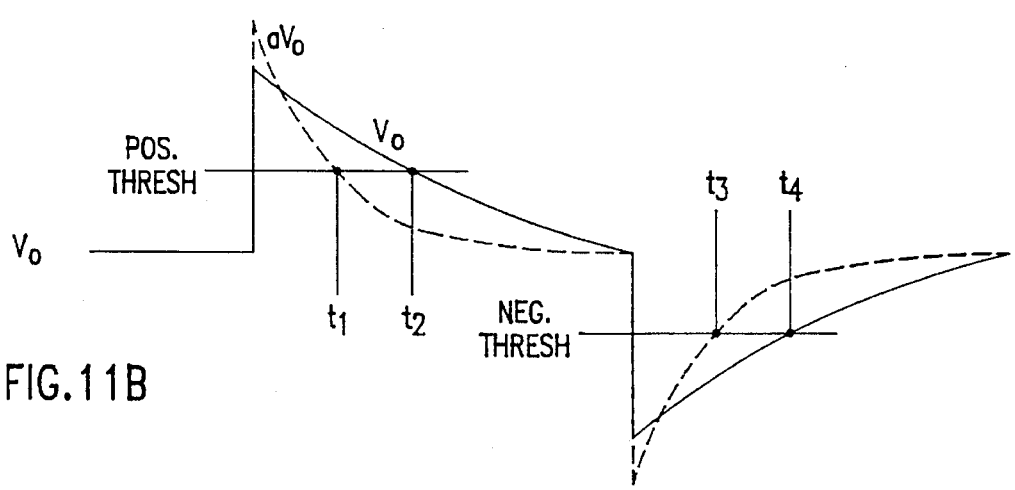

PATCHING PANEL SCANNER

FIELD OF THE INVENTION

The present invention relates to computer communication generally and more particularly to apparatus for interconnection of data ports.

BACKGROUND OF THE INVENTION

Computer communications have become commonplace in recent years. In modern work environments, local area networks are provided for interconnecting a plurality of computers and peripheral apparatus. Generally, the local area networks incorporate computer cabling systems which include distribution panels at which connection between various computer ports and user ports are located.

In many cases, the interconnections between the various ports are relatively complicated and often create a cabling spaghetti, which is extremely difficult to manage. As a result computer software has been developed to enable management of cabling systems. A review of such software appears in "The Great Cabling Treasure Hunt" by M. Jander, Data communications, Mar. 21, 1991.

Even using the most advanced cable management software, there nevertheless remains a massive job of manually entering connection information for use by the software.

SUMMARY OF THE INVENTION

The present invention seeks to provide apparatus for obviating the present manual task of identifying and collecting cable connection information.

There is thus provided in accordance with a preferred embodiment of the present invention a local area network including cabling interconnecting a plurality of workstations, the cabling including a plurality of data ports and conductors for selectable and removable interconnection between selected ones of the data ports and apparatus for automatically providing an indication of the connection pattern of the data ports.

In accordance with a preferred embodiment of the present invention, the apparatus for automatically providing an indication of the connection pattern comprises:

transducer apparatus operatively associated with the conductors at ends thereof adjacent the data ports, at least one element of the transducer apparatus associated with each conductor being operative to impose a signal on a portion of the conductor and at least one of the transducer apparatus associated with each conductor being operative to pick off the signal from the conductor;

apparatus, connected to the transducer apparatus, for identifying the existence of signal paths along the conductors between the pluralities of ports; and output apparatus, coupled to the apparatus for identifying, for providing an output indication of the connection pattern.

In accordance with a preferred embodiment of the present invention, the conductors comprise patch cables and the apparatus for automatically providing an indication of the current connection pattern comprises:

signal transducer apparatus operatively associated with at least one conductor of each patch cable at the ends thereof adjacent the data ports, at least one element of the signal transducer apparatus associated with each cable being operative to impose a signal on the at least one conductor of the cable and at least one of the signal transducer apparatus associated with each cable being operative to pick off the signal from the at least one conductor of the cable;

apparatus, connected to the signal transducer apparatus, for identifying the existence of signal paths along the cables between the pluralities of ports; and output apparatus, coupled to the apparatus for identifying, for providing an output indication of the connection pattern produced by connection of the cables to the pluralities of ports.

In accordance with a preferred embodiment of the present invention, the conductors comprise patch cables and the apparatus for automatically providing an indication of the current connection pattern comprises:

induction apparatus operatively associated with shielding of the patch cables at the ends thereof adjacent the data ports, at least one of the induction apparatus associated with each cable being operative to impose a signal on the shielding of the cable and at least one of the induction apparatus associated with each cable being operative to pick off the signal from the shielding of the cable;

apparatus, connected to the induction apparatus, for identifying the existence of signal paths along the cables between the pluralities of ports; and output apparatus, coupled to the apparatus for identifying, for providing an output indication of the connection pattern produced by connection of the cables to the pluralities of ports.

There is also provided in accordance with a preferred embodiment of the present invention apparatus for providing an indication of the current connection pattern of a multiplicity of data ports, pluralities of which are interconnected by shielded cables, the apparatus comprising:

induction apparatus operatively associated with shielding of the shielded cables at the ends thereof adjacent the data ports, at least one of the induction apparatus associated with each cable being operative to impose a signal on the shielding of the cable and at least one of the induction apparatus associated with each cable being operative to pick off the signal from the shielding of the cable;

apparatus, connected to the induction apparatus, for identifying the existence of signal paths along the cables between the pluralities of ports; and output apparatus, coupled to the apparatus for identifying, for providing an output indication of the connection pattern produced by connection of the cables to the pluralities of ports.

Additionally in accordance with a preferred embodiment of the present invention there is provided apparatus for providing an indication of the current connection pattern of a multiplicity of data ports, pluralities of which are interconnected by multiconductor cables, the apparatus comprising:

signal transducer apparatus operatively associated with at least one conductor of each multiconductor cable at the ends thereof adjacent the data ports, at least one of the signal transducer apparatus associated with each cable being operative to impose a signal on the at least one conductor of the cable and at least one of the signal transducer apparatus associated with each cable being operative to pick off the signal from the at least one conductor of the cable;

apparatus, connected to the signal transducer apparatus, for identifying the existence of signal paths along the cables between the pluralities of ports; and output apparatus, coupled to the apparatus for identifying, for providing an output indication of the connection pattern produced by connection of the cables to the pluralities of ports.

Preferably the signal transducer apparatus is operative to impose a signal on at least one conductor which does not carry any other signal.

In accordance with a preferred embodiment of the present invention the signal transducer apparatus is operative to impose a signal on at least one conductor which may carry other signals and includes apparatus for isolating the signal imposed thereby from the other signals, thereby to prevent unacceptable interference therewith.

Further in accordance with a preferred embodiment of the present invention there is provided apparatus for providing an indication of the current connection pattern of a multiplicity of data ports, pluralities of which are interconnected by cables, the apparatus comprising:

- transducer apparatus operatively associated with the cables at the ends thereof adjacent the data ports, at least one of the transducer apparatus associated with each cable being operative to impose a signal on a portion of the cable and at least one of the transducer apparatus associated with each cable being operative to pick off the signal from the cable;
- apparatus, connected to the transducer apparatus, for identifying the existence of signal paths along the cables between the pluralities of ports; and
- output apparatus, coupled to the apparatus for identifying, for providing an output indication of the connection pattern produced by connection of the cables to the pluralities of ports. Preferably the transducer apparatus is operative to impose a signal on at least one conductor which does not carry any other signal.

In accordance with a preferred embodiment of the present invention the transducer apparatus is operative to impose a signal on at least one conductor which may carry other signals and includes apparatus for isolating the signal imposed thereby from the other signals, thereby to prevent unacceptable interference therewith.

In accordance with a preferred embodiment of the present invention there is provided a local area network comprising cabling interconnecting at least one computer and a plurality of workstations, the cabling including a plurality of data ports, including at least one computer port and a plurality of user ports, and patch cables for selectable and removable interconnection between selected ones of the user ports and the computer ports and apparatus for automatically providing an indication of the current connection pattern of the computer ports and the user ports.

In accordance with a preferred embodiment of the invention, the apparatus for automatically providing an indication of the current connection pattern comprises:

- transducer apparatus operatively associated with the patch cables at the ends thereof adjacent the data ports, at least one of the transducer apparatus associated with each cable being operative to impose a signal on a portion of the cable and at least one of the transducer apparatus associated with each cable being operative to pick off the signal from the cable;
- apparatus, connected to the transducer apparatus, for identifying the existence of signal paths along the cables between the pluralities of ports; and
- output apparatus, coupled to the apparatus for identifying, for providing an output indication of the connection pattern produced by connection of the cables to the pluralities of ports.

In accordance with another embodiment of the present invention, the apparatus for automatically providing an indication of the current connection pattern comprises:

- signal transducer apparatus operatively associated with at least one conductor of each patch cable at the ends thereof adjacent the data ports, at least one of the signal transducer apparatus associated with each cable being operative to impose a signal on the at least one conductor of the cable and at least one of the signal transducer apparatus associated with each cable being operative to pick off the signal from the at least one conductor of the cable;
- apparatus, connected to the signal transducer apparatus, for identifying the existence of signal paths along the cables between the pluralities of ports; and
- output apparatus, coupled to the apparatus for identifying, for providing an output indication of the connection pattern produced by connection of the cables to the pluralities of ports.

Additionally in accordance with a preferred embodiment of the present invention the apparatus for automatically providing an indication of the current connection pattern comprises:

- induction apparatus operatively associated with shielding of the patch cables at the ends thereof adjacent the data ports, at least one of the induction apparatus associated with each cable being operative to impose a signal on the shielding of the cable and at least one of the induction apparatus associated with each cable being operative to pick off the signal from the shielding of the cable;
- apparatus, connected to the induction apparatus, for identifying the existence of signal paths along the cables between the pluralities of ports; and
- output apparatus, coupled to the apparatus for identifying, for providing an output indication of the connection pattern produced by connection of the cables to the pluralities of ports.

Further in accordance with a preferred embodiment of the present invention there is provided a computer system comprising at least one main computer, a plurality of workstations and a local area network interconnecting the at least one main computer and the plurality of workstations, the local area network comprising:

- cabling interconnecting at least one computer and a plurality of workstations, the cabling including a plurality of data ports, including at least one computer port and a plurality of user ports, and patch cables for selectable and removable interconnection between selected ones of the user ports and the computer ports and apparatus for automatically providing an indication of the current connection pattern of the computer ports and the user ports.

Preferably the apparatus for automatically providing an indication of the current connection pattern comprises:

- transducer apparatus operatively associated with the patch cables at the ends thereof adjacent the data ports, at least one of the transducer apparatus associated with each cable being operative to impose a signal on a portion of the cable and at least one of the transducer apparatus associated with each cable being operative to pick off the signal from the cable;
- apparatus, connected to the transducer apparatus, for identifying the existence of signal paths along the cables between the pluralities of ports; and output apparatus, coupled to the apparatus for identifying, for providing an output indication of the connection pattern produced by connection of the cables to the pluralities of ports.

Additionally in accordance with a preferred embodiment of the present invention there is provided a computer system wherein the apparatus for automatically providing an indication of the current connection pattern comprises:

signal transducer apparatus operatively associated with at least one conductor of each patch cable at the ends thereof adjacent the data ports, at least one of the signal transducer apparatus associated with each cable being operative to impose a signal on the at least one conductor of the cable and at least one of the signal transducer apparatus associated with each cable being operative to pick off the signal from the at least one conductor of the cable;

apparatus, connected to the signal transducer apparatus, for identifying the existence of signal paths along the cables between the pluralities of ports; and output apparatus, coupled to the apparatus for identifying, for providing an output indication of the connection pattern produced by connection of the cables to the pluralities of ports.

Additionally in accordance with a preferred embodiment of the present invention there is provided a computer system wherein the apparatus for automatically providing an indication of the current connection pattern comprises:

induction apparatus operatively associated with shielding of the patch cables at the ends thereof adjacent the data ports, at least one of the induction apparatus associated with each cable being operative to impose a signal on the shielding of the cable and at least one of the induction apparatus associated with each cable being operative to pick off the signal from the shielding of the cable;

apparatus, connected to the induction apparatus, for identifying the existence of signal paths along the cables between the pluralities of ports; and output apparatus, coupled to the apparatus for identifying, for providing an output indication of the connection pattern produced by connection of the cables to the pluralities of ports.

It is appreciated that in accordance with an embodiment of the invention, any one or combination of the techniques described hereinbelow for scanning the connection status of the various ports may be employed in a single system.

It is appreciated that various signals that are induced by the connection status scanner do not cause interference with the data signals passing through the data ports.

The present invention is operative to scan not only point to point connection configurations but also point to multipoint connection configurations, without requiring additional hardware.

The present invention does not require any addition to or modification of standard patching cables which are presently used in LANs.

BRIEF DESCRIPTION OF THE DRAWINGS

The present invention will be more fully understood and appreciated from the following detailed description, taken in conjunction with the drawings in which:

FIGS. 1A, 1B and 1C are simplified illustrations of a computer system constructed and operative in accordance with three alternative preferred embodiments of the invention;

FIGS. 10A and 10B are illustrations of signal paths which occur for two different connection arrangements in the apparatus of FIG. 9;

FIGS. 11A and 11B are timing diagrams illustrating differentiation between desired signals and interference along the signal paths of FIGS. 10A and 10B;

DETAILED DESCRIPTION OF A PREFERRED EMBODIMENT

Figure 1B:
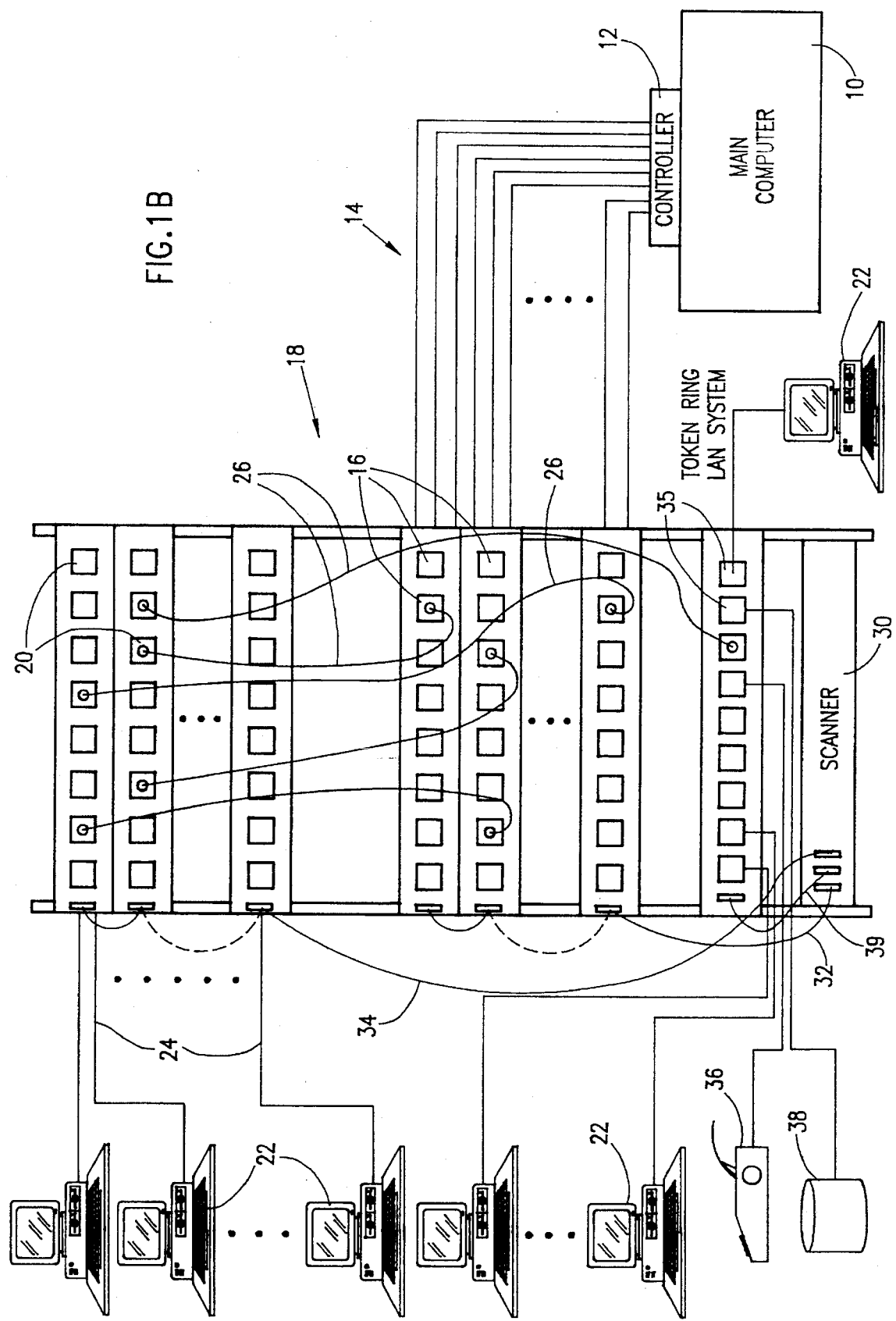

Reference is now made to FIG. 1A, which illustrates a computer system constructed and operative in accordance with a preferred embodiment of the present invention. The computer system comprises a main computer 10, such as an IBM mainframe, which is coupled, typically via a controller 12, such as a IBM 3270, and local area network cabling 14, typically type I, ICS cabling, to a plurality of computer ports 16 forming part of a distribution panel 18.

The distribution panel 18 also comprises a plurality of user ports 20 to which are coupled individual computers, terminals or work stations 22, hereinafter referred to collectively as "work stations" by apparatus of local area network cabling 24, such as type I, ICS cabling.

Interconnections between individual computer ports 16 and individual user ports 20 are provided by patching cables 26 or alternatively by apparatus of internal connections in patching panels such as the CLPP cordless patching panel commercially available from RIT Technologies Ltd. of Tel Aviv, Israel.

In accordance with a preferred embodiment of the present invention, a scanner 30 is provided for automatically and, preferably, continuously sensing the interconnection arrangement of the patching cables and thus the interconnection status of the various computer ports 16 and user ports 20. The scanner 30 may provide an interconnection status output to computer 10 or to any other computer or display in the system, including, for example, a dedicated output device.

Scanner 30 is coupled to computer ports 16 via cables 32 and is coupled to user ports 22 by means of cables 34.

Reference is now made to FIG. 1B, which illustrates a computer system constructed and operative in accordance with another preferred embodiment of the present invention. Similarly to the embodiment of FIG. 1A, the computer system comprises a main computer 10, which is coupled, typically via a controller 12, and local area network cabling 14, to a plurality of computer ports 16 forming part of a distribution panel 18.

As in the embodiment of FIG. 1A, the distribution panel 18 also comprises a plurality of user ports 20 to which are coupled work stations, by means of local area network cabling 24.

As distinguished from the embodiment of FIG. 1A, the distribution panel 18 also includes a plurality of token ring LAN ports 35 which are interconnected by a conventional token ring LAN. Work stations 22 as well as peripheral devices such as printers 36 and disk storage devices 38 may also be coupled to the token ring LAN ports 35.

Interconnections between individual computer ports 16, individual user ports 20 and LAN ports 35 are provided by patching cables 26 or alternatively by means of internal connections in patching panels, as mentioned above.

In accordance with a preferred embodiment of the present invention, a scanner 30 is provided for automatically and, preferably, continuously sensing the interconnection arrangement of the patching cables and thus the interconnection status of the various computer ports 16, user ports 20, and LAN ports 35. The scanner 30 may provide an interconnection status output to computer 10 or to any other computer or display in the system, including, for example, a dedicated output device.

Scanner 30 is coupled to computer ports 16 via cables 32, to user ports 22 by means of cables 34 and to LAN ports 35 by means of cables 39.

Figure 1C:
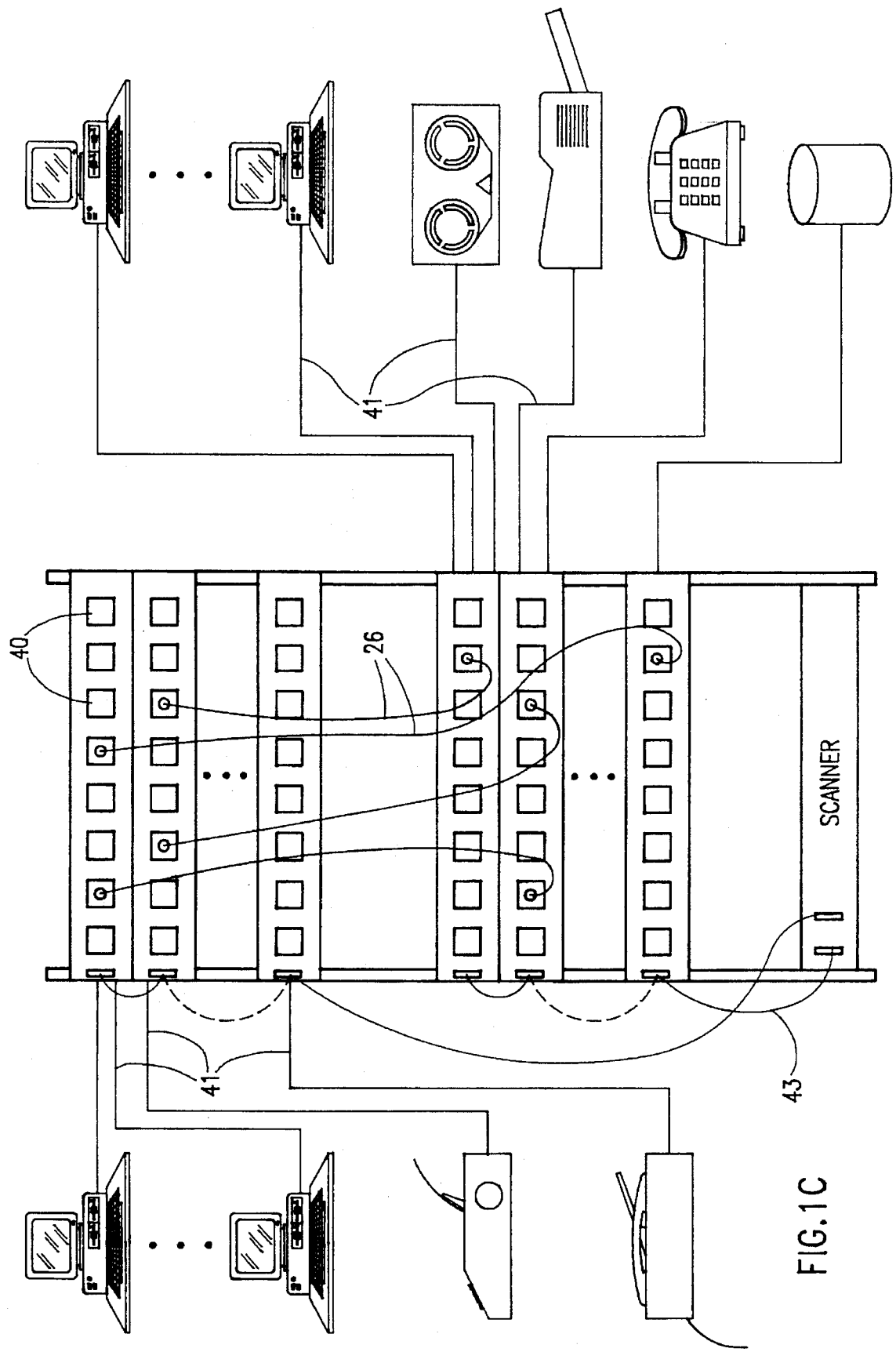

Reference is now made to FIG. 1C, which illustrates a computer system constructed and operative in accordance with yet another preferred embodiment of the present invention. As distinguished from the embodiments of FIGS. 1A and 1B, the computer system need not comprise a main computer but rather may comprise a multiplicity of ports 40 which need not be classified as computer ports, user ports or LAN ports and which may be connected to workstations and peripherals as desired, as by local area network cabling 41.

Interconnections between individual ports 40 are provided by patching cables 26 or alternatively by means of internal connections in patching panels, as mentioned above.

In accordance with a preferred embodiment of the present invention, a scanner 30 is provided for automatically and, preferably, continuously sensing the interconnection arrangement at least of the patching cables and possibly of the internal connections and thus the interconnection status of the various ports 40. The scanner 30 may provide an interconnection status output to any computer or workstation in the system, including, for example, a dedicated output device.

Scanner 30 is coupled to the various ports via cables 43.

Figure 2:
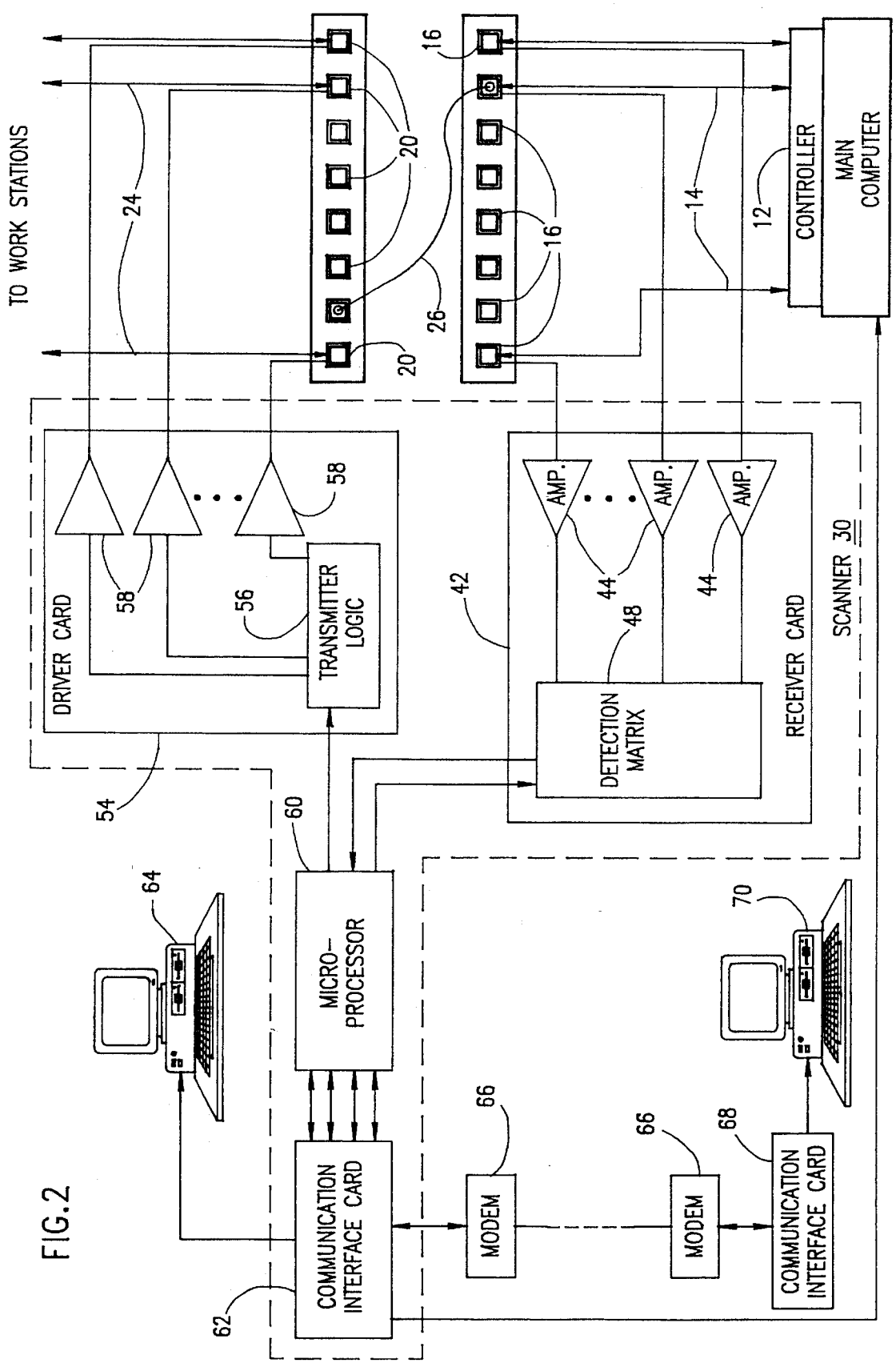
FIG. 2 is a simplified detailed illustration of part of the system of FIGS. 1A–1C.

Reference is now made to FIG. 2 which is a more detailed illustration of part of the scanner apparatus of FIG. 1A. It is to be appreciated that the structure illustrated in FIG. 2 and the remaining figures herein is applicable in principle also to the embodiments of FIGS. 1A–1C.

As seen in FIG. 2, the controller 12 is connected via cabling 14 to computer ports 16, which are in turn coupled to scanner 30. Scanner 30 includes a plurality of receiver cards 42, each of which includes a plurality of pre-amplifiers 44, such as OP 16 amplifiers, commercially available from Analog Devices, each receiving a single channel and outputting to a detection matrix 48, whose function is to determine at which user port there are present signals transmitted via a patch cable 26 from a given computer port 16.

A plurality of work stations are connected by means of cabling 24 to corresponding user ports 20, which are coupled, in turn to driver cards 54 of scanner 30. The driver card 54 includes transmitter logic circuitry 56, a preferred embodiment of which is described hereinafter in greater detail, which outputs to the individual user ports via a plurality of corresponding drivers 58, such as 2N3906 transistors, commercially available from Motorola.

The transmitter logic circuitry 56 receives scanning inputs from a microprocessor 60 which provides overall control functions for the scanner 30 and controls both the detection matrix 48 and the transmitter logic circuitry 56.

Generally speaking, the microprocessor 60 causes signal inputs to be applied to the various user ports 20 and scans the computer ports 16 to detect such signal inputs. In such a way, the scanner 30 is operative to determine which user ports 20 are connected to which computer ports 16.

Microprocessor 60 is also operative to report information regarding which user ports 20 are connected to which computer ports 16, via a communication interface card 62, either to an adjacent computer 64 or alternatively via a pair of modems 66 and another communication interface card 68 to a remotely located computer 70. Alternatively or additionally, the microprocessor 60 may report the connection status via communication interface card 62 to the main computer. The connection to the main computer may be direct or via the LAN system.

It is to be appreciated that the user ports 20 and the computer ports 16 may be interchanged in the system of FIG. 2, such that the driver cards 54 are coupled to the computer ports 16 and the receiver cards 42 are coupled to the user ports 20. It is further noted that, as in the embodiment of FIG. 1C, the distinction between user ports and computer ports may be eliminated entirely, and signals may be transmitted at any selected port and picked off at any selected port. Furthermore, it is envisioned that the interconnection status of ports which are not interconnected by patch cables, but rather by other conductors, may also be determined on a real time basis in accordance with the present invention.

Figure 3:
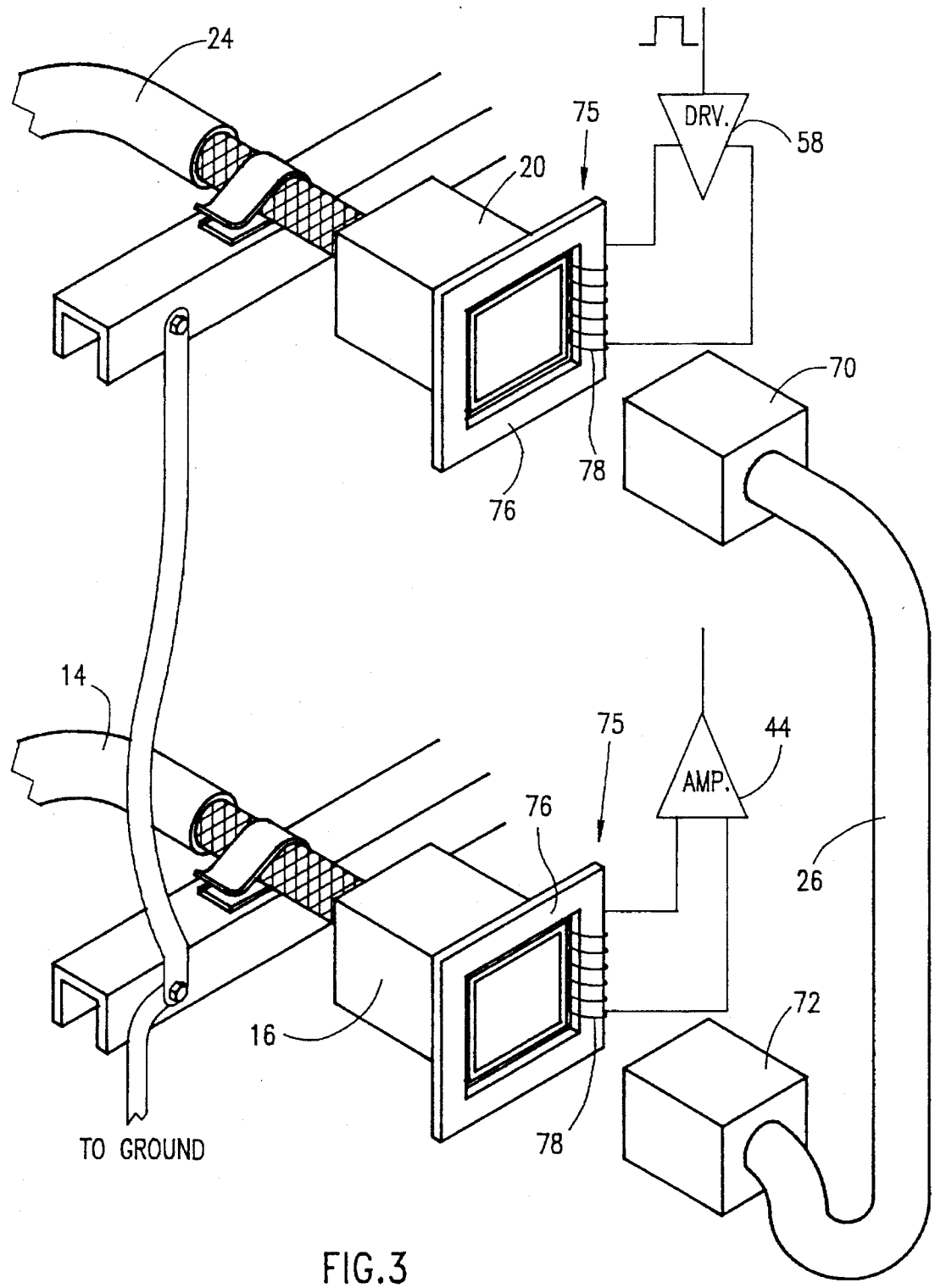
FIG. 3 is a simplified detailed illustration of part of the apparatus of FIG. 2.

Reference is now made to FIG. 3, which illustrates in greater detail the interconnections between an individual user port 20 and an individual computer port 16. The patch cable 26 is shown with connectors 70 and 72 adapted for connection to the user port 20 and the computer port 16.

In accordance with a preferred embodiment of the present invention, there is associated with each of computer ports 16 and user ports 20 an inductive coupler 75, typically comprising a ferromagnetic frame 76, which is wound with a coil 78. The coil 78 of the coupler 75 associated with user port 20 is coupled to the output of driver 58, while the coil 78 of the coupler 75 associated with computer port 16 is coupled to the input to amplifier 44. In this manner, coupler 75 of port 20 is operative to impose a signal onto patch cable 26, if connected to port 20, and coupler 75 of port 16 is operative to pick up such signal on patch cable 26, if a patch cable 26 is coupled to port 16.

Figure 4:
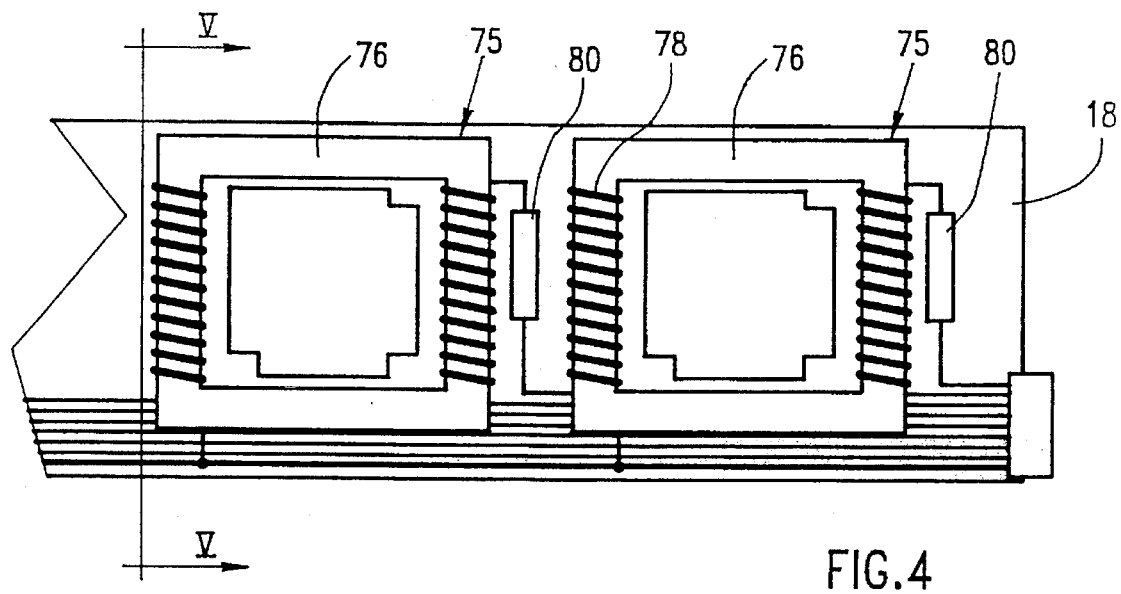
FIG. 4 is a simplified detailed illustration of part of the apparatus of FIG. 3.
Figure 5:
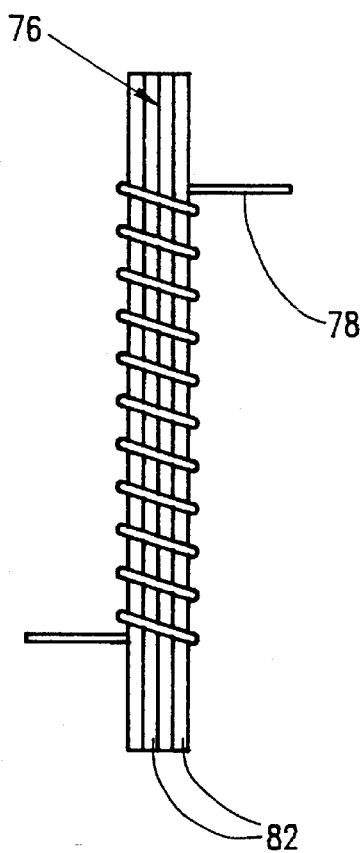
FIG. 5 is a side view illustration taken along the lines V—V of FIG. 4.

FIGS. 4 and 5 illustrate in even greater detail a preferred embodiment of part of a distribution panel 18 including a plurality of ports 16 or 20 together with their inductive couplers 75 and the wiring thereto including matrix diodes 80, such as 1N4148 diodes. It is seen that frames 76 typically include a plurality of parallel plates 82 and typically two coils 78 are associated with each frame 76.

Figure 6A:
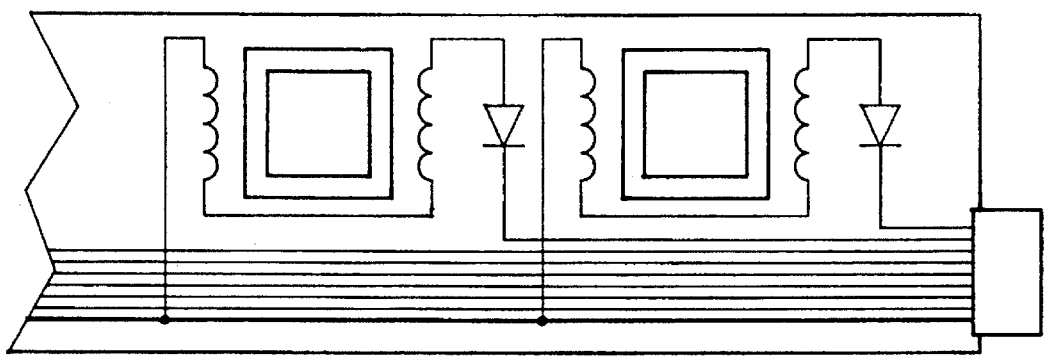
FIGS. 6A, 6B, 6C, 6D and 6E are simplified illustrations of five typical circuit arrangements useful in the apparatus of FIGS. 3–5.
Figure 6B:
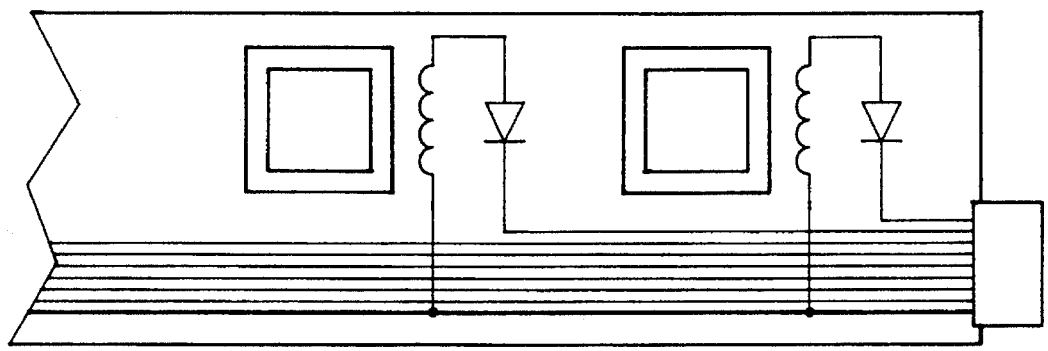
Figure 6C:
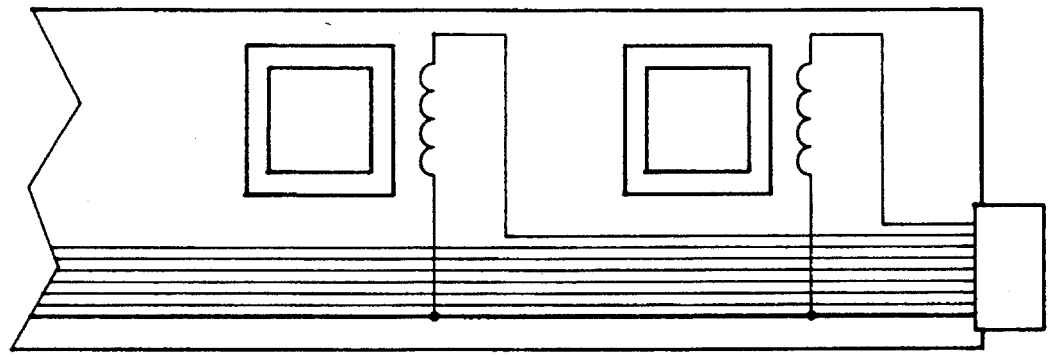
Figure 6D:
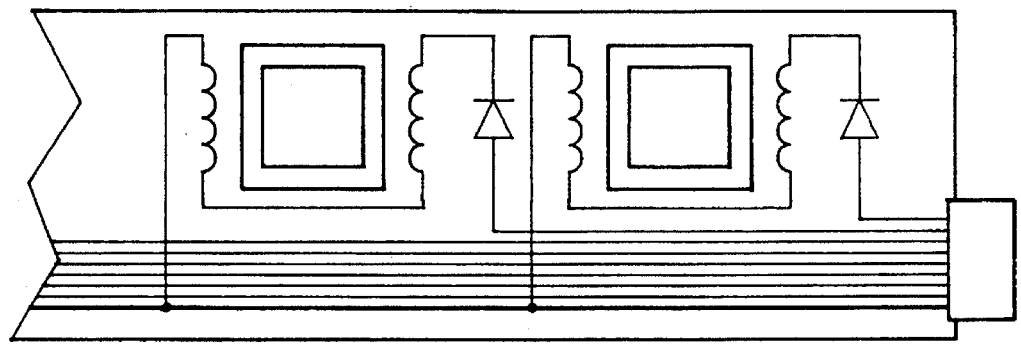
Figure 6E:
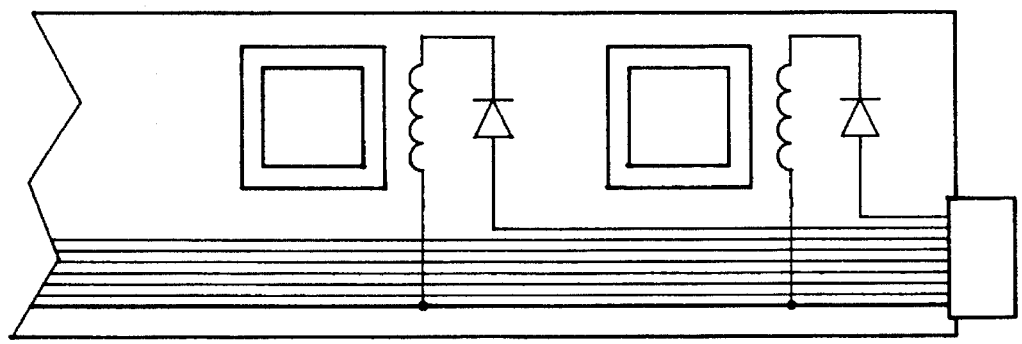

Reference is now made to FIGS. 6A–6E, which illustrate three alternative arrangements of couplers 75. The arrangement of FIG. 6A corresponds to that shown in FIGS. 4 and 5. The arrangement of FIG. 6B corresponds to that shown in FIG. 3 with the addition of diodes 80. The arrangement of FIG. 6C corresponds to that shown in FIG. 3. Here the diodes 80 are incorporated in the driver card or receiver card. FIGS. 6D and 6E illustrate arrangements corresponding to those of FIGS. 6A and 6B but with the opposite diode direction.

Figure 7:
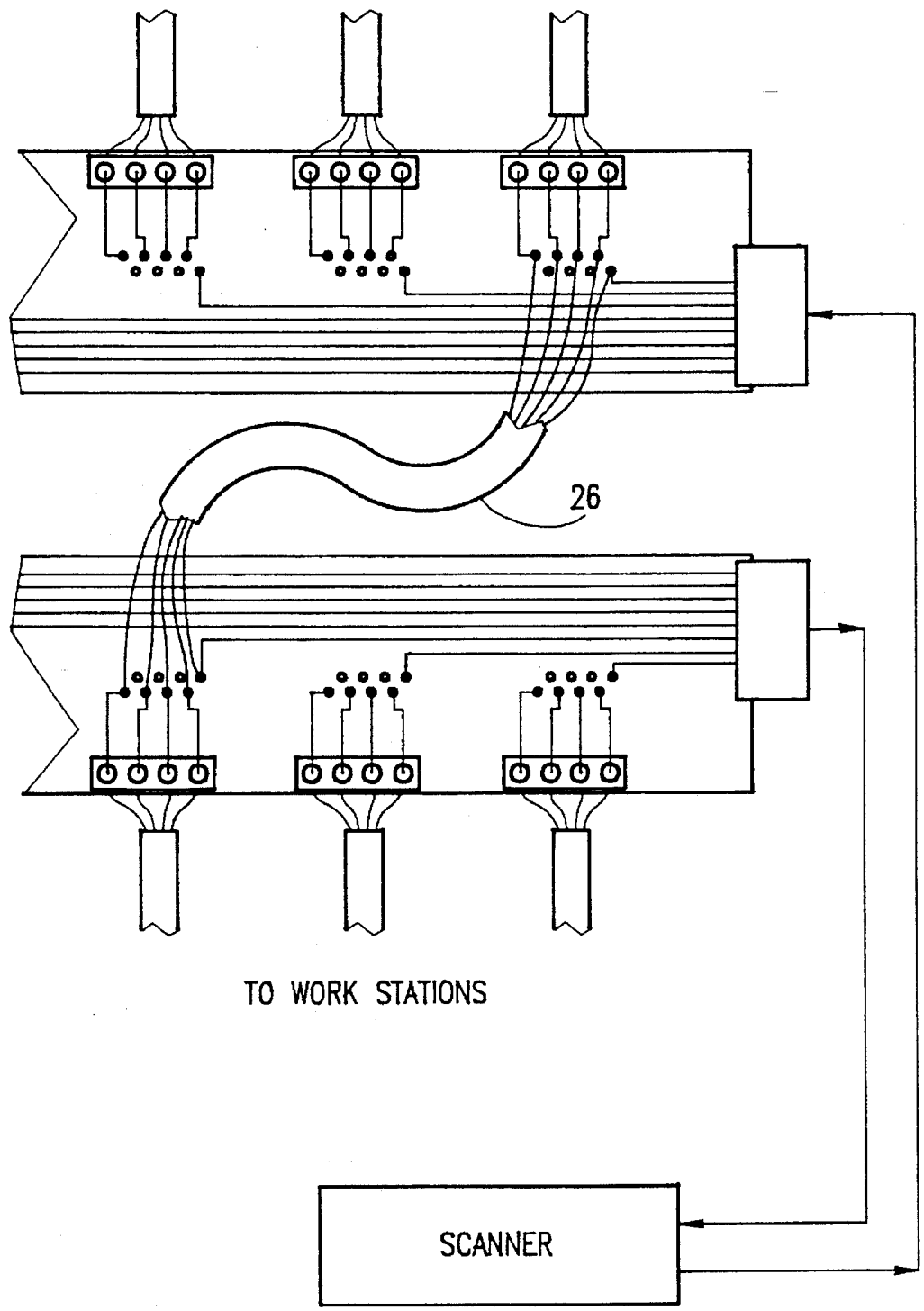
FIG. 7 is a simplified illustration of an alternative embodiment of part of the apparatus of FIGS. 1A–1C and 2.

Reference is now made to FIG. 7, which illustrates an alternative embodiment of the invention of FIGS. 1 and 2, wherein the inductive couplers 75 are replaced by dry contacts to a conductor coupled to either of the computer port 16 or the user port 20. In FIG. 7, an arrangement is shown wherein the dry contact between the driver card or the receiver card with the port is to a conductor which is dedicated to this purpose and does not carry any other signal.

Figure 8:
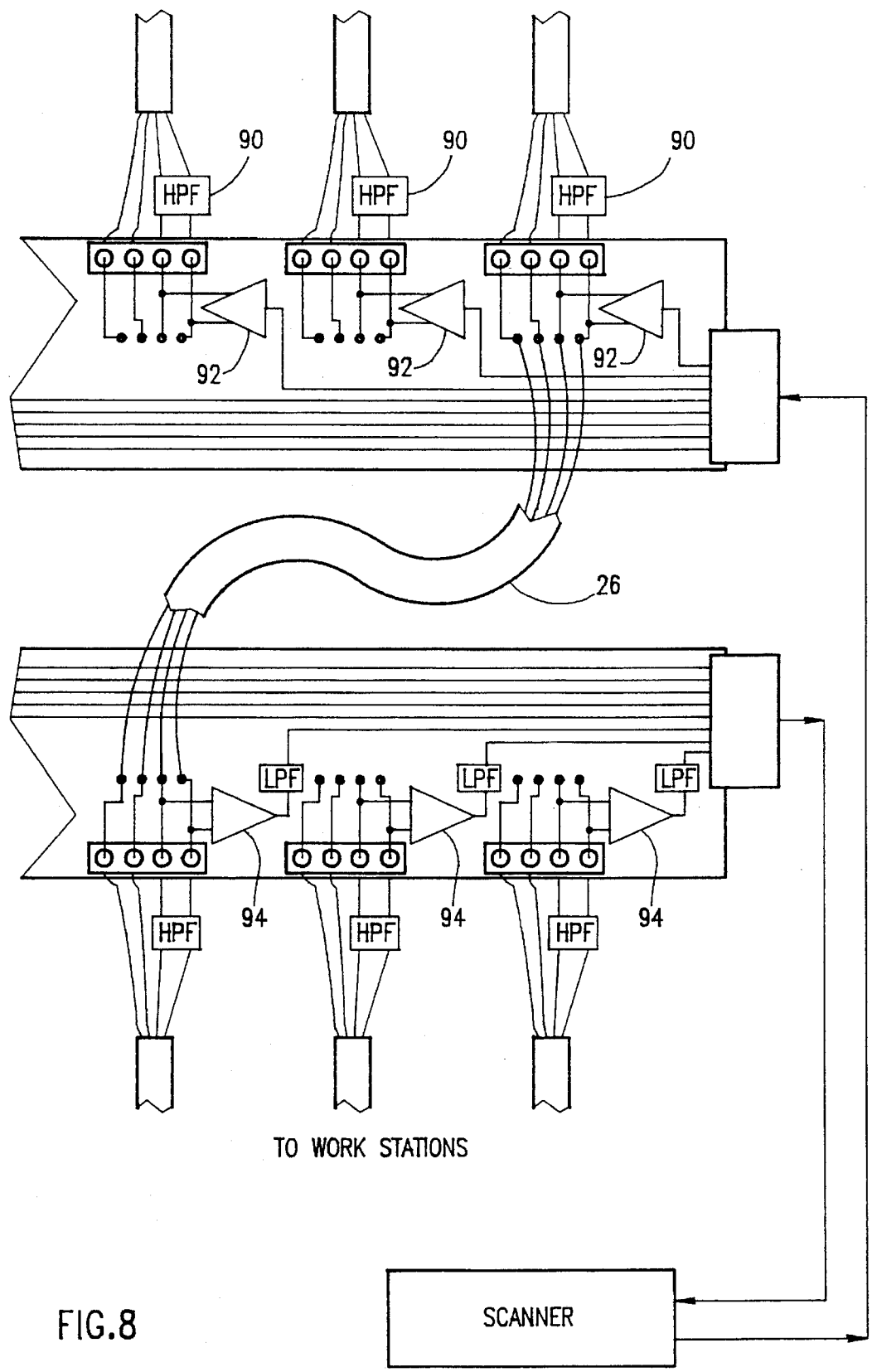
FIG. 8 is a simplified illustration of a further alternative embodiment of part of the apparatus of FIGS. 1A–1C and 2.

FIG. 8 illustrates a variation of the embodiment of FIG. 7, wherein a dry contact connection is made to a conductor which also serves to carry other signals. In such a case, as illustrated, high pass filters 90 are interposed between the ports and the main computer and workstations and low pass filters are associated with the signal pick ups.

In the embodiment of FIG. 8, a preferred common mode signal imposition technique is employed wherein differential drivers 92 are employed to impose signals onto two conductors which also carry data. Differential amplifiers 94 are employed for receiving the imposed signals.

Figure 9:
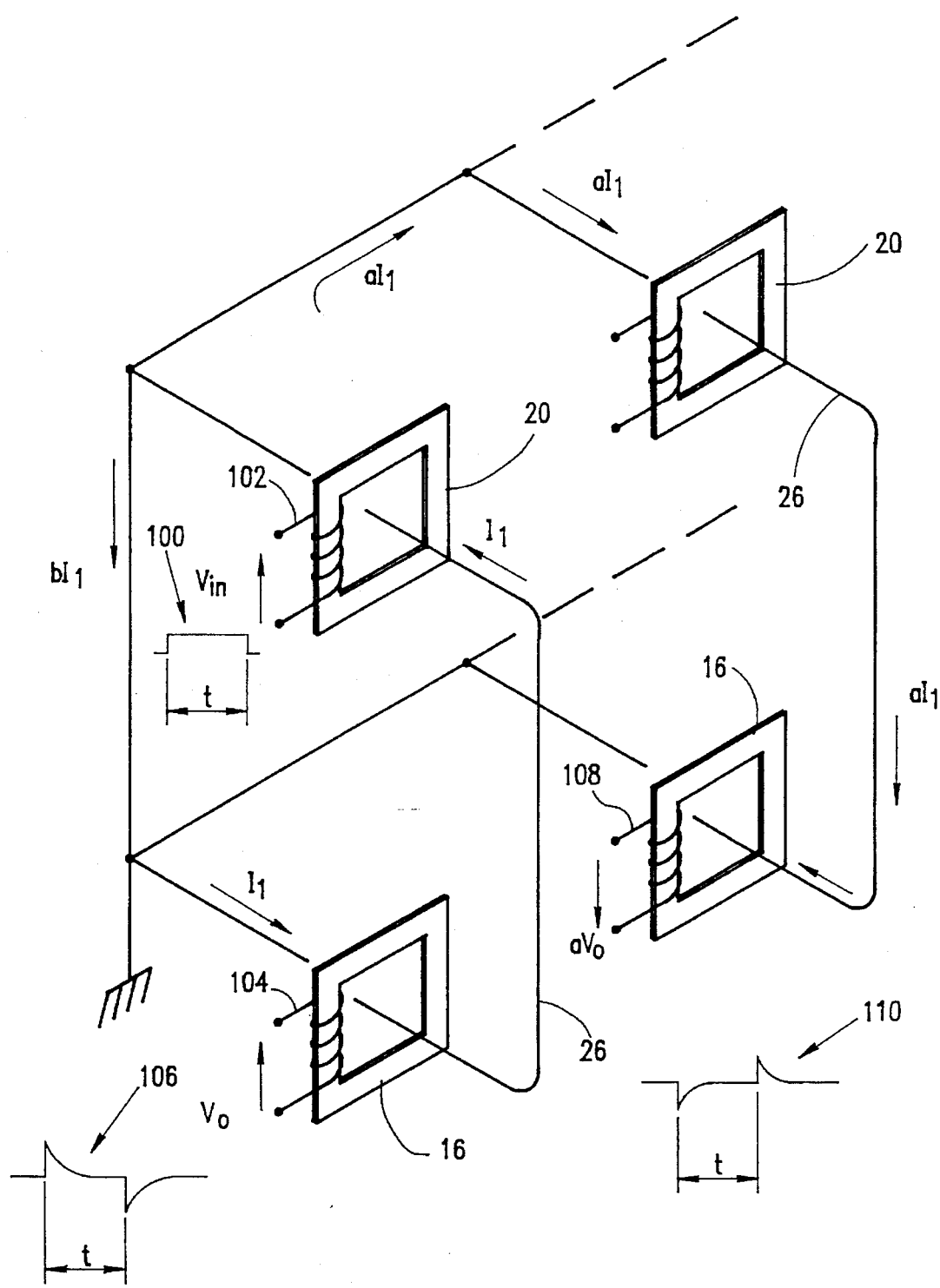
FIG. 9 is a simplified conceptual illustration of the apparatus of FIGS. 3–6E, indicating an aspect of its operation.

Reference is now made to FIG. 9, which is employed to illustrate particular features of the operation of the apparatus of the invention. The patch cable interconnection between ports 16 and 20 provides a signal path I1, such that if a square wave signal, $V_{in}$, indicated by reference numeral 100 is transmitted via an induction coupling coil 102 along path I1, the time derivative of that signal as received at port 16 and picked up by an induction coupling coil 104 will appear as indicated at reference numeral 106.

Due to unwanted current flows within the distribution panel, there are also present additional, unwanted, signal paths, which are represented in FIG. 9 by a signal path aI1, where "a", represents an attenuation factor, less than unity. It has been appreciated by the inventors that the time derivative of the signal 100 which is received over the unwanted signal paths has an opposite polarity from that of the signal 106 received at the opposite end of the patch cable. Accordingly, the signal picked up by coils 108 lying along the unwanted signal path or paths aI1 and downstream of a patch cable 26 have a time derivative which appears as indicated by reference numeral 110.

It is a particular feature of the present invention that the polarity difference in the signal time derivative is employed to enable the scanner 30 to differentiate signals passed along a patch cable or its equivalent conductor from signals passed along unwanted signal paths.

Reference is now made to FIGS. 10A and 10B which illustrate another aspect of the operation of the apparatus of the invention. Where ports which receive signals from scanner 30 are physically adjacent ports at which signals are picked up, signal flux leakage can result in unwanted signal reception at ports which are not connected by a patch cable to a port receiving that signal.

FIG. 10A illustrates first and second adjacent ports which are not connected by a patch cable or equivalent but which are coupled in an unwanted manner by signal flux leakage. FIG. 10B illustrates similar adjacent ports which are connected by a patch cable 26 or its equivalent.

Assuming that in both cases a voltage signal of the type illustrated in FIG. 11A is applied to respective induction coils 120 and 122, the signal received at a coil 124 along the patch cable 26 or its equivalent will appear as indicated by solid line $V_o$, and has a first decay time constant while the signal received at a coil 126 due to signal flux leakage has a second decay time constant, which is shorter than the first decay time constant. This is true because the ratio of inductance to resistance, which determines the decay time constant, is much greater for the signal path including a patch cable than for a signal path not including a patch cable.

The relationship between the two signals $V_o$ and $aV_o$ is illustrated in FIG. 11B from where it can be seen that application of positive and/or negative thresholds can be employed to distinguish between the two signals. Circuitry which employs these thresholds is incorporated into the apparatus of the present invention.

Figure 12:
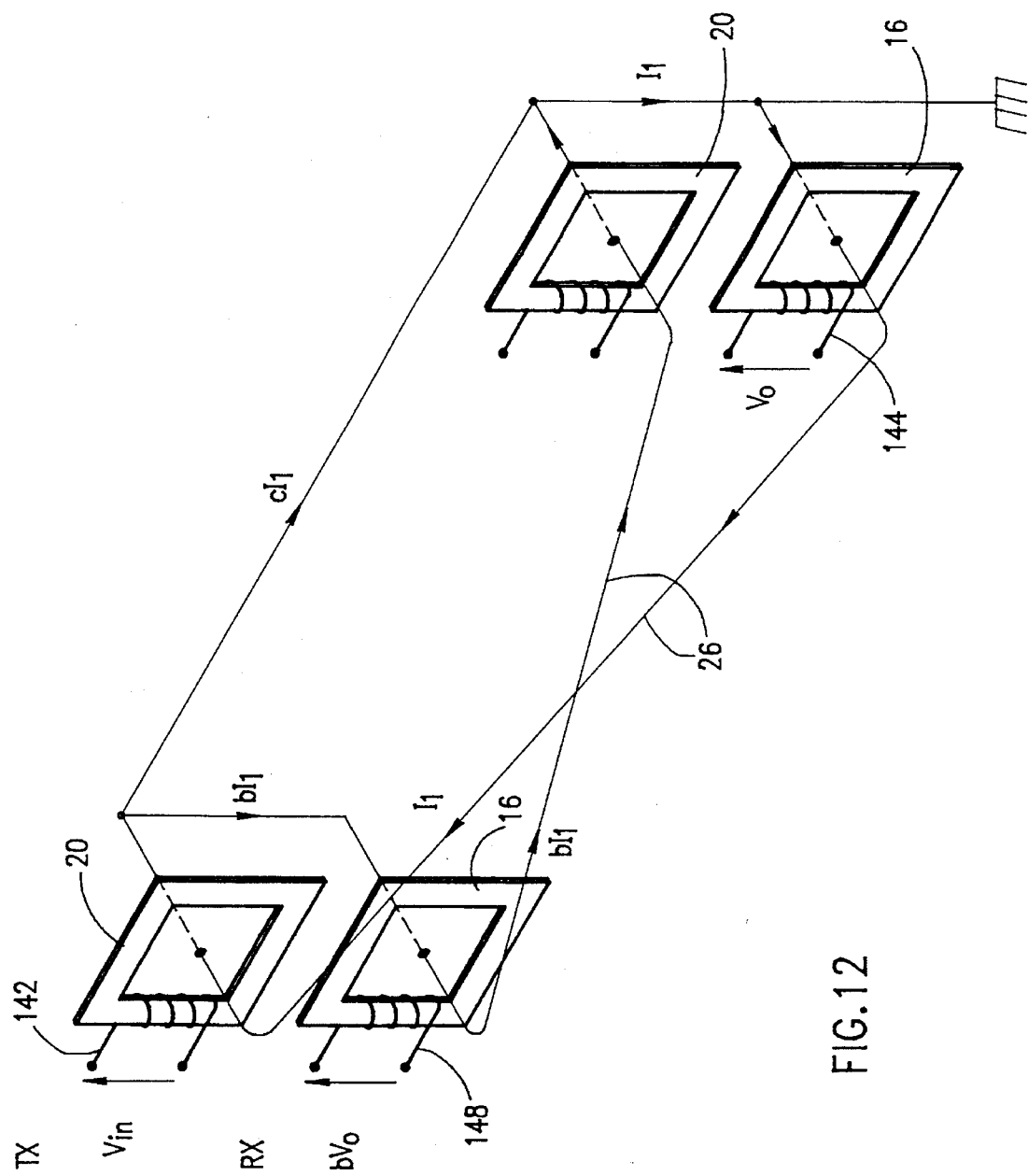
FIG. 12 an illustration of signal paths which occur for another two alternative connection arrangements in the apparatus of FIG. 9.
Figure 13A:
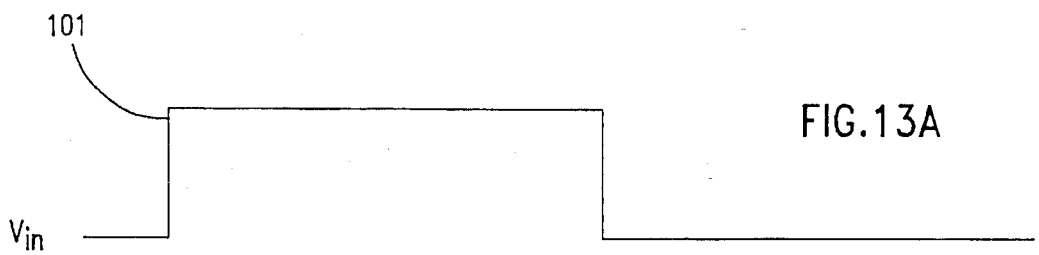
FIGS. 13A and 13B are timing diagrams illustrating differentiation between desired signals and interference along the signal paths of FIG. 12.
Figure 13B:
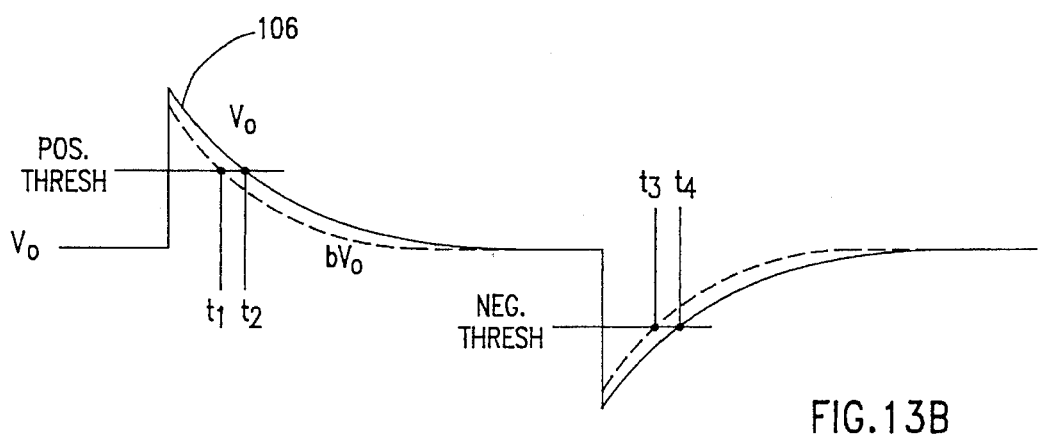

Reference is now made to FIG. 12, 13A and 13B, which are employed to illustrate additional particular features of the operation of the apparatus of the invention. The patch cable interconnection between ports 16 and 20 provides a signal path I1, such that if a square wave signal, $V_{in}$, indicated by reference numeral 101 in FIG. 13A is transmitted via an induction coupling coil 142 along path I1, the time derivative of that signal as received at port 16 and picked up by an induction coupling coil 144 will appear as indicated at reference numeral 106 in FIG. 13B.

Due to unwanted current flows within the distribution panel, there are also present additional, unwanted, signal paths, which are represented in FIG. 12 by a signal path bI1, where b, represents an attenuation factor, less than unity. It has been appreciated by the inventors that the time derivative of the signal 101 which is received over the unwanted signal paths has the same polarity as that of the signal 106 received at the opposite end of the patch cable. Accordingly, the signal $bV_o$ picked up by coils 148 lying along the unwanted signal path or paths bI1 and downstream of another patch cable 26 is not distinguishable from signal 106 by its time derivative.

It has been appreciated by the present inventors that the signals picked up by coils 144 (the wanted signal) and 148 (the unwanted signal) in the arrangement of FIG. 12 may be distinguished by their relative amplitude.

It is a particular feature of the present invention that the amplitude of the signals is employed to enable the scanner 30 to differentiate signals passed along a patch cable or its equivalent conductor directly between connected ports from signals passed along the unwanted signal paths.

The relationship between the two signals $V_o$ and $bV_o$ is illustrated in FIG. 13B from where it can be seen that application of positive and/or negative thresholds can be employed to distinguish between the two signals. Circuitry which employs these thresholds is incorporated into the apparatus of the present invention.

Figure 14:
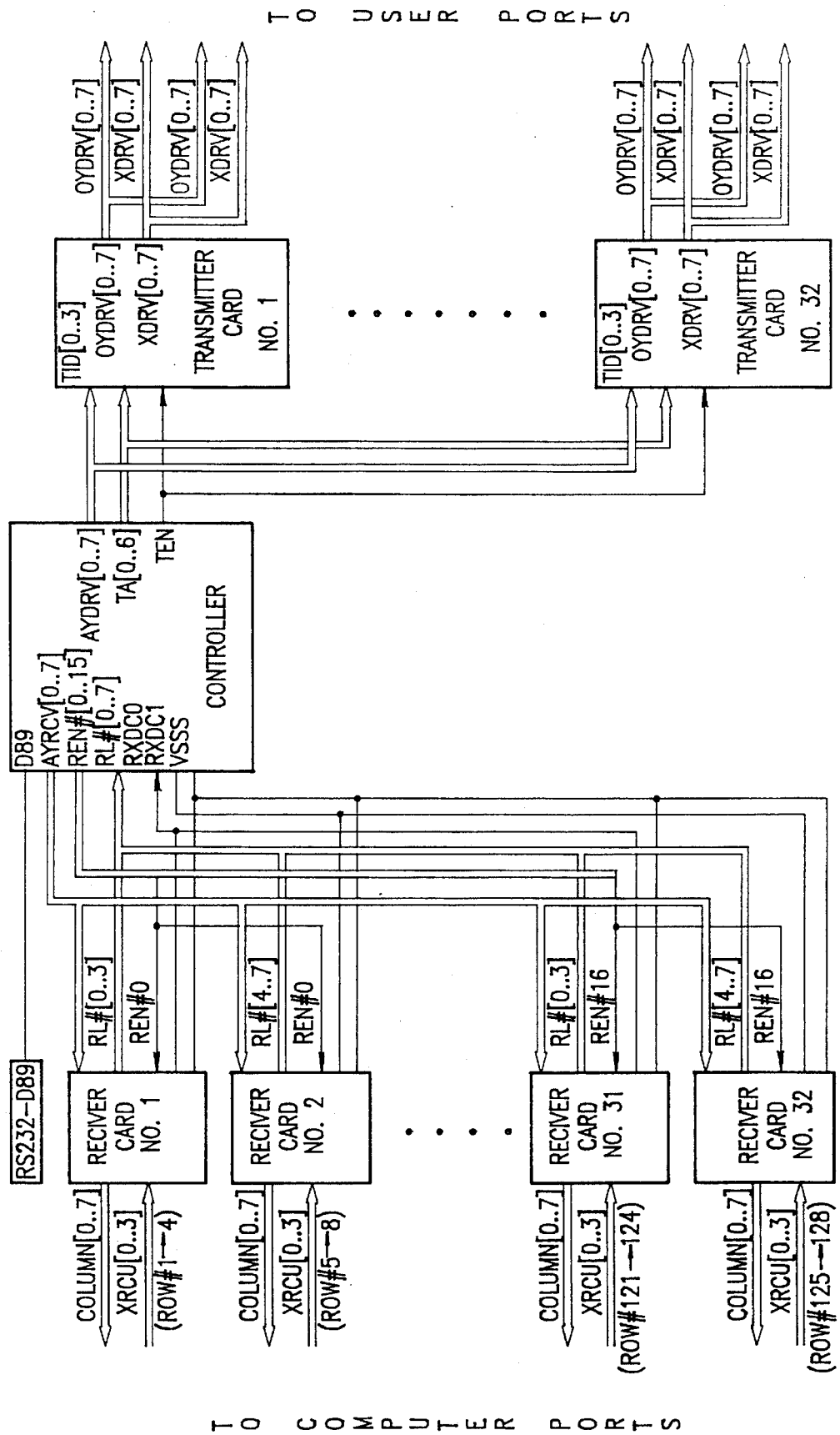
FIG. 14 is a overall diagram of a specific embodiment of the scanner apparatus of FIG. 2.

Reference is now made to FIG. 14, which is an overall schematic illustration of a preferred embodiment of the invention corresponding to FIG. 2. Annex I, found in the file wrapper but not printed, is a net list setting forth with particularity the configuration of a preferred embodiment of the apparatus of FIG. 2. Annex II, found in the file wrapper but not printed, is a listing of the software embodied in microprocessor 60 (FIG. 2) forming part of the controller of FIG. 14, and which is used to operate the apparatus specified in Annex I.

It will be appreciated by persons skilled in the art that the present invention is not limited by what has been particularly shown and described hereinabove. Rather the scope of the present invention is defined only by the claims which follow:

We claim:

1. Apparatus for providing an indication of a connection pattern of a multiplicity of data ports, pluralities of which are interconnected by shielded cables having cable shields which are electrically interconnected to each other, said apparatus comprising:

inductive couplers operatively associated with shielding of said shielded cables at ends thereof adjacent said data ports, said inductive couplers including a plurality of transmitter couplers each associated with a cable and being operative to impose a signal on said shielding of said cable and a plurality of receiver couplers each being operative to pick off said signal from said shielding of said cable;

receiver circuitry, connected to said plurality of receiver couplers, for identifying signals received by each of said receiver couplers, the receiver circuitry including apparatus for distinguishing between signals received along a cable and signals passed along unwanted signal paths; and an output indicator, coupled to said receiver circuitry, for providing an output indication of said connection pattern produced by connection of said cables to said pluralities of ports.

2. Apparatus according to claim 1 and also comprising means for distinguishing signals received along a cable from signals passed along unwanted signal paths according to their phase.

3. Apparatus according to claim 1 and also comprising means for distinguishing signals received along a cable from signals passed along unwanted signal paths according to their delay time constant.

4. Apparatus according to claim 1 and also comprising means for distinguishing signals received along a cable from signals passed along unwanted signal paths, according to their amplitude.

5. Apparatus for providing an indication of a connection pattern of a multiplicity of data ports, pluralities of which are interconnected by multiconductor cables, said apparatus comprising:

at least one signal transducer operatively associated with at least one conductor of each multiconductor cable at ends thereof adjacent said data ports, at least one of said signal transducers associated with each cable being operative to impose a signal on said at least one conductor of said cable and at least one of said signal transducers associated with each cable being operative to pick off said signal from said at least one conductor of said cable, said signal transducer being operative to impose a signal on at least one conductor which may carry other signals and includes circuitry for isolating said signal imposed thereby from said other signals, thereby to prevent unacceptable interference therewith;

receiver circuitry, connected to said signal transducer, for identifying existence of signal paths along said cables between said pluralities of ports; and an output indicator, coupled to said receiver circuitry, for providing an output indication of said connection pattern produced by connection of said cables to said pluralities of ports.

6. Apparatus according to claim 5 and wherein said circuitry for isolating comprises high pass and low pass filters.

7. Apparatus for providing an indication of a connection pattern of a multiplicity of data ports, pluralities of which are interconnected by cables, said apparatus comprising:

at least one transducer operatively associated with said cables at ends thereof adjacent said data ports, at least one of said transducers associated with each cable being operative to impose a signal on a portion of said cable and at least one of said transducers associated with each cable being operative to pick off said signal from said cable, said transducer being operative to impose a signal on at least one conductor which may carry other signals and includes circuitry for isolating said signal imposed thereby from said other signals, thereby to prevent unacceptable interference therewith;

receiver circuitry, connected to said transducer, for identifying existence of signal paths along said cables between said pluralities of ports; and an output indicator, coupled to said receiver circuitry, for providing an output indication of said connection pattern produced by connection of said cables to said pluralities of ports.

8. Apparatus according to claim 7 and wherein said circuitry for isolating comprises high pass and low pass filters.

9. A local area network comprising cabling interconnecting at least one computer and a plurality of workstations, said cabling including a plurality of data ports, including at least one computer port and a plurality of user ports, and patch cables for selectable and removable interconnection between selected ones of said user ports and said computer ports and apparatus for automatically providing an indication of the current connection pattern of a multiplicity of data ports, pluralities of which are interconnected by cables, and wherein said apparatus for automatically providing an indication of said current connection pattern comprises:

at least one transducer operatively associated with said patch cables at ends thereof adjacent said data ports, at least one of said transducers associated with each cable being operative to impose a signal on a portion of said cable and at least one of said transducers associated with each cable being operative to pick off said signal from said cable, said transducer being operative to impose a signal on at least one conductor which may carry other signals and includes circuitry for isolating said signal imposed thereby from said other signals, thereby to prevent unacceptable interference therewith;

receiver circuitry, connected to said transducer, for identifying existence of signal paths along said cables between said pluralities of ports; and an output indicator, coupled to said receiver circuitry, for providing an output indication of said connection pattern produced by connection of said cables to said pluralities of ports.

10. Apparatus according to claim 9 and wherein said circuitry for isolating comprises high pass and low pass filters.

11. A local area network comprising cabling interconnecting at least one computer and a plurality of work stations, said cabling including a plurality of data ports, including at least one computer port and a plurality of user ports, and patch cables for selectable and removable interconnection between selected ones of said user ports and said computer ports and apparatus for automatically providing an indication of the current connection pattern of a multiplicity of data ports, pluralities of which are interconnected by shielded cables having cable shields which are electrically interconnected to each other, and wherein said apparatus for automatically providing an indication of said current connection pattern comprises:

inductive couplers operatively associated with shielding of said shielded cables at ends thereof adjacent said data ports, said inductive couplers including a plurality of transmitter couplers each associated with a cable and being operative to impose a signal on said shielding of said cable and a plurality of receiver couplers each being operative to pick off said signal from said shielding of said cable;

receiver circuitry, connected to said plurality of receiver couplers, for identifying signals received by each of said receiver couplers, the receiver circuitry including apparatus for distinguishing between signals received along a cable and signals passed along unwanted signal paths; and an output indicator, coupled to said receiver circuitry, for providing an output indication of said connection pattern produced by connection of said cables to said pluralities of ports.

12. Apparatus according to claim 11 and also comprising means for distinguishing signals received along a cable from signals passed along unwanted signal paths according to their phase.

13. Apparatus according to claim 11 and also comprising means for distinguishing signals received along a cable from signals passed along unwanted signal paths, according to their delay time constant.

14. Apparatus according to claim 11 and also comprising means for distinguishing signals received along a cable from signals passed along unwanted signal paths, according to their amplitude.

15. A computer system comprising at least one main computer, a plurality of workstations and a local area network interconnecting said at least one main computer and said plurality of workstations, said local area network comprising:

cabling interconnecting at least one computer and a plurality of workstations, said cabling including a plurality of data ports, including at least one computer port and a plurality of user ports, and patch cables for selectable and removable interconnection between selected ones of said user ports and said computer ports and apparatus for automatically providing an indication of the current connection pattern of a multiplicity of data ports, pluralities of which are interconnected by cables, and wherein said apparatus for automatically providing an indication of said current connection pattern comprises:

at least one transducer operatively associated with said patch cables at ends thereof adjacent said data ports, at least one of said transducers associated with each cable being operative to impose a signal on a portion of said cable and at least one of said transducers associated with each cable being operative to pick off said signal from said cable, said transducer being operative to impose a signal on at least one conductor which may carry other signals and includes circuitry for isolating said signal imposed thereby from said other signals, thereby to prevent unacceptable interference therewith;

receiver circuitry, connected to said transducer, for identifying existence of signal paths along said cables between said pluralities of ports; and an output indicator, coupled to said receiver circuitry, for providing an output indication of said connection pattern produced by connection of said cables to said pluralities of ports.

16. Apparatus according to claim 15 and wherein said circuitry for isolating comprises high pass and low pass filters.

17. A computer system comprising at least one main computer, a plurality of workstations and a local area network interconnecting said at least one main computer and said plurality of workstations, said local area network comprising:

cabling interconnecting at least one computer and a plurality of workstations, said cabling including a plurality of data ports, including at least one computer port and a plurality of user ports, and patch cables for selectable and removable interconnection between selected ones of said user ports and said computer ports and apparatus for automatically providing an indication of the current connection pattern of a multiplicity of data ports, pluralities of which are interconnected by shielded cables having cable shields which are electrically interconnected, and wherein said apparatus for automatically providing an indication of said current connection pattern comprises:

inductive couplers operatively associated with shielding of said shielded cables at ends thereof adjacent said data ports, said inductive couplers including a plurality of transmitter couplers each associated with a cable and being operative to impose a signal on said shielding of said cable and a plurality of receiver couplers each being operative to pick off said signal from said shielding of said cable;

receiver circuitry, connected to said plurality of receiver couplers, for identifying signals received by each of said receiver couplers, the receiver circuitry including apparatus for distinguishing between signals received along a cable and signals passed along unwanted signal paths; and an output indicator, coupled to said receiver circuitry, for providing an output indication of said connection pattern produced by connection of said cables to said pluralities of ports.

18. Apparatus according to claim 17 and also comprising means for distinguishing signals received along a cable from signals passed along unwanted signal paths according to their phase.

19. Apparatus according to claim 17 and also comprising means for distinguishing signals received along a cable from signals passed along unwanted signal paths, according to their delay time constant.

20. Apparatus according to claim 17 and also comprising means for distinguishing signals received along a cable from signals passed along unwanted signal paths, according to their amplitude.

21. Apparatus for providing an indication of a connection pattern of a multiplicity of data ports, pluralities of which are interconnected by conductors, said apparatus comprising:

at least one transducer operatively associated with said conductors at ends thereof adjacent said data ports, at least one of said transducers associated with each conductor being operative to impose a signal on a portion of said conductor and at least one of said transducers associated with each conductor being operative to pick off said signal from said conductor, said transducer being operative to impose a signal on at least one conductor which may carry other signals and includes circuitry for isolating said signal imposed thereby from said other signals, thereby to prevent unacceptable interference therewith;

receiver circuitry, connected to said transducer, for identifying existence of signal paths along said conductors between said pluralities of ports; and an output indicator, coupled to said receiver circuitry, for providing an output indication of said connection pattern produced by connection of said conductors to said pluralities of ports.

22. Apparatus according to claim 21 and wherein said circuitry for isolating comprises high pass and low pass filters.

23. A local area network comprising cabling interconnecting a plurality of workstations, said cabling including a plurality of data ports and conductors for selectable and removable interconnection between selected ones of said data ports and apparatus for automatically providing an indication of the current connection pattern of a multiplicity of data ports pluralities of which are interconnected by cables, and wherein said apparatus for automatically providing an indication of said current connection pattern comprises:

at least one transducer operatively associated with said conductors at ends thereof adjacent said data ports, at least one of said transducers associated with each conductor being operative to impose a signal on a portion of said conductor and at least one of said transducers associated with each conductor being operative to pick off said signal from said conductor, said transducer being operative to impose a signal on at least one conductor which may carry other signals and includes circuitry for isolating said signal imposed thereby from said other signals, thereby to prevent unacceptable interference therewith;

receiver circuitry, connected to said transducer, for identifying existence of signal paths along said conductors between said pluralities of ports; and an output indicator, coupled to said receiver circuitry, for providing an output indication of said connection pattern.

24. Apparatus according to claim 23 and wherein said circuitry for isolating comprises high pass and low pass filters.

25. A local area network comprising cabling interconnecting a plurality of workstations, said cabling including a plurality of data ports, including at least one computer port and a plurality of user ports, and patch cables for selectable and removable interconnection between selected ones of said user ports and said computer ports and apparatus for automatically providing an indication of the current connection pattern of a multiplicity of data ports, pluralities of which are interconnected by shielded cables having cable shields which are electrically interconnected, and wherein said apparatus for automatically providing an indication of said current connection pattern comprises:

inductive couplers operatively associated with shielding of said patch cables at ends thereof adjacent said data ports, said inductive couplers including a plurality of transmitter couplers each associated with a cable and being operative to impose a signal on said shielding of said cable and a plurality of receiver couplers each being operative to pick off said signal from said shielding of said cable;

receiver circuitry connected to said plurality of receiver couplers, for identifying signals received by each of said receiver couplers the receiver circuitry including apparatus for distinguishing between signals received along a cable and signals passed along unwanted signal paths; and an output indicator, coupled to said receiver circuitry, for providing an output indication of said connection pattern produced by connection of said cables to said pluralities of ports.

26. Apparatus according to claim 25 and also comprising means for distinguishing signals received along a cable from signals passed along unwanted signal paths according to their phase.

27. Apparatus according to claim 25 and also comprising means for distinguishing signals received along a cable from signals passed along unwanted signal paths, according to their delay time constant.

28. Apparatus according to claim 25 and also comprising means for distinguishing signals received along a cable from signals passed along unwanted signal paths, according to their amplitude.

* * * * *